United States Patent
Hack

(10) Patent No.: US 9,899,457 B2
(45) Date of Patent: Feb. 20, 2018

(54) FLEXIBLE OLED DISPLAY HAVING INCREASED LIFETIME

(71) Applicant: Universal Display Corporation, Ewing, NJ (US)

(72) Inventor: Michael Hack, Princeton, NJ (US)

(73) Assignee: Universal Display Corporation, Ewing, NJ (US)

( * ) Notice: Subject to any disclaimer, the term of this patent is extended or adjusted under 35 U.S.C. 154(b) by 14 days.

(21) Appl. No.: 14/695,845

(22) Filed: Apr. 24, 2015

(65) Prior Publication Data
US 2016/0315129 A1  Oct. 27, 2016

(51) Int. Cl.
*H01L 51/50* (2006.01)
*H01L 27/32* (2006.01)
*H01L 51/00* (2006.01)

(52) U.S. Cl.
CPC ...... *H01L 27/3244* (2013.01); *H01L 51/0097* (2013.01); *H01L 51/5016* (2013.01); *H01L 27/3206* (2013.01); *H01L 27/3262* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS http://www.flexenable.com/technology/; FlexEnable Limited; c. 2015; printed Apr. 24, 2015.

(Continued)

*Primary Examiner* — Benjamin Sandvik
(74) *Attorney, Agent, or Firm* — Morris & Kamlay LLP

(57) ABSTRACT

Embodiments of the disclosed subject matter provide a device including an active-matrix driven flexible display including a plurality of Organic Light Emitting Diodes (OLEDs) formed on a plastic substrate, where each OLED includes a phosphorescent first emissive layer, where the display operates at a luminance value of at least 500 cd/m² with a luminance decay of not more than about 3% after 10,000 hours of operation, and where the display is formed on the plastic substrate having a glass transition temperature of the less than 200° C.

15 Claims, 4 Drawing Sheets

(56) References Cited

U.S. PATENT DOCUMENTS

| | | | |
|---|---|---|---|
| 7,279,704 | B2 | 10/2007 | Walters et al. |
| 7,431,968 | B1 | 10/2008 | Shtein et al. |
| 7,968,146 | B2 | 6/2011 | Wagner et al. |
| 8,766,531 | B1 | 7/2014 | Hack et al. |
| 8,957,579 | B2 | 2/2015 | Weaver et al. |
| 2003/0230980 | A1 | 12/2003 | Forrest et al. |
| 2004/0085019 | A1* | 5/2004 | Su ............ H05B 33/22 313/506 |
| 2004/0174116 | A1 | 9/2004 | Lu et al. |
| 2006/0055008 | A1* | 3/2006 | Wang ......... H01L 27/3276 257/666 |
| 2007/0216610 | A1* | 9/2007 | Smith ......... H01L 27/3204 345/76 |
| 2010/0178728 | A1* | 7/2010 | Zheng ......... H01L 51/0053 438/99 |
| 2010/0264419 | A1* | 10/2010 | Iwasaki ....... H01L 29/7869 257/59 |
| 2011/0284899 | A1* | 11/2011 | Hack ......... H01L 51/5016 257/98 |
| 2012/0273976 | A1* | 11/2012 | David ......... H01L 51/5237 257/790 |
| 2012/0286245 | A1* | 11/2012 | Levermore ... H01L 51/0097 257/40 |
| 2014/0077688 | A1* | 3/2014 | Weaver ....... H01L 51/5004 313/504 |

OTHER PUBLICATIONS

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

* cited by examiner

FLEXIBLE OLED DISPLAY HAVING INCREASED LIFETIME

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to flexible organic light emitting diode (OLED) having an increased lifetime, and other devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

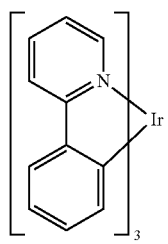

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment of the disclosed subject matter, a device is provided that includes an active-matrix driven flexible display including a plurality of Organic Light Emitting Diodes (OLEDs) formed on a plastic substrate, where each OLED includes a phosphorescent first emissive layer, where the display operates at a luminance value of at least 500 cd/m$^2$ with a luminance decay of not more than about 3% after 10,000 hours of operation, and where the display is formed on the plastic substrate having a glass transition temperature of the less than 200° C.

According to another embodiment, a first device comprising a first organic light emitting device is also provided. The first organic light emitting device can include an anode, a cathode, and an organic layer, disposed between the anode and the cathode. The organic layer can be formed on a plastic substrate, where each organic layer includes a phosphorescent first emissive layer, where the display operates at a luminance value of at least 500 cd/m$^2$ with a luminance decay of not more than about 3% after 10,000 hours of operation, and where the organic layer is formed on the plastic substrate having a glass transition temperature of the less than 200° C. The first device can be a consumer product, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
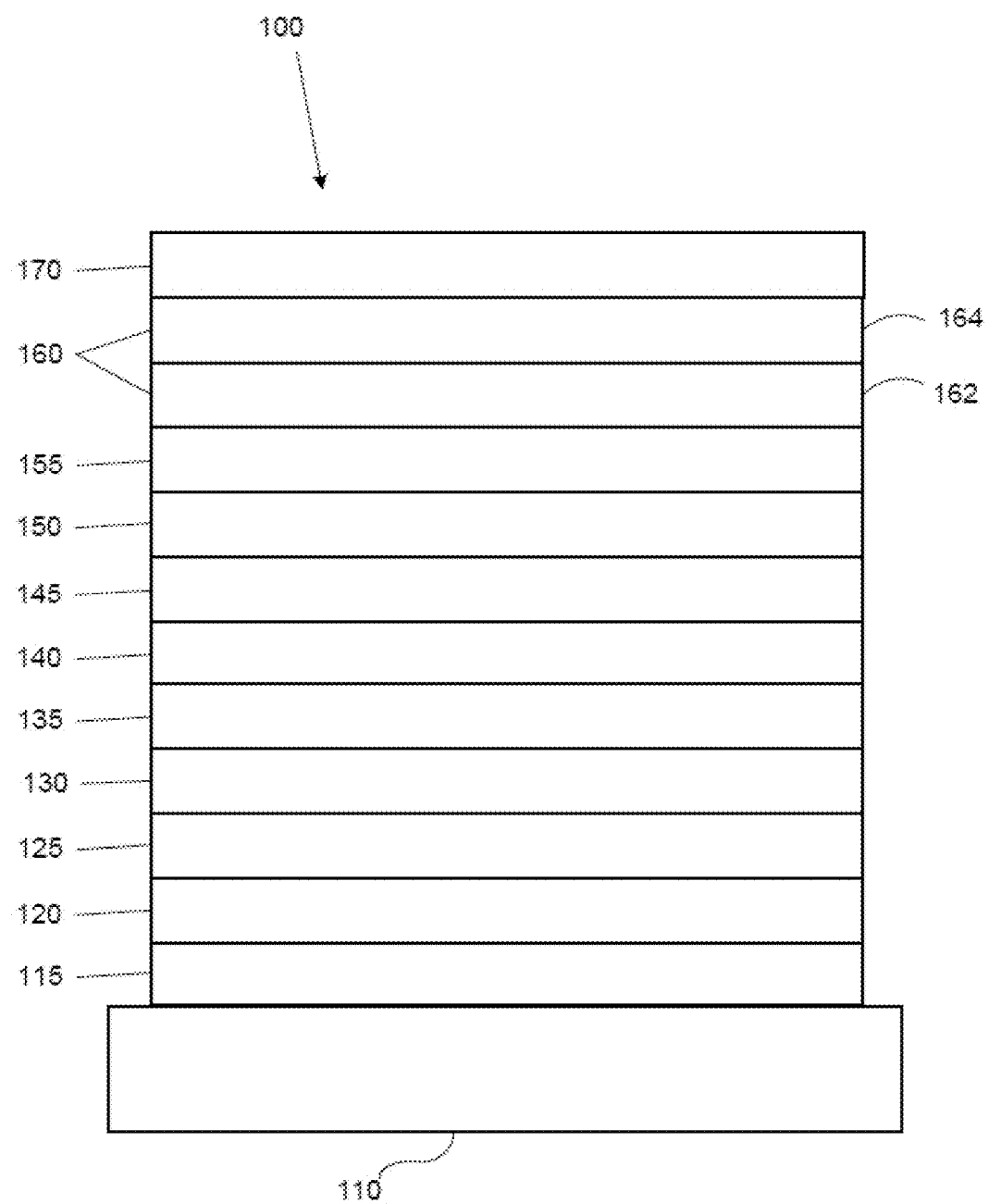
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
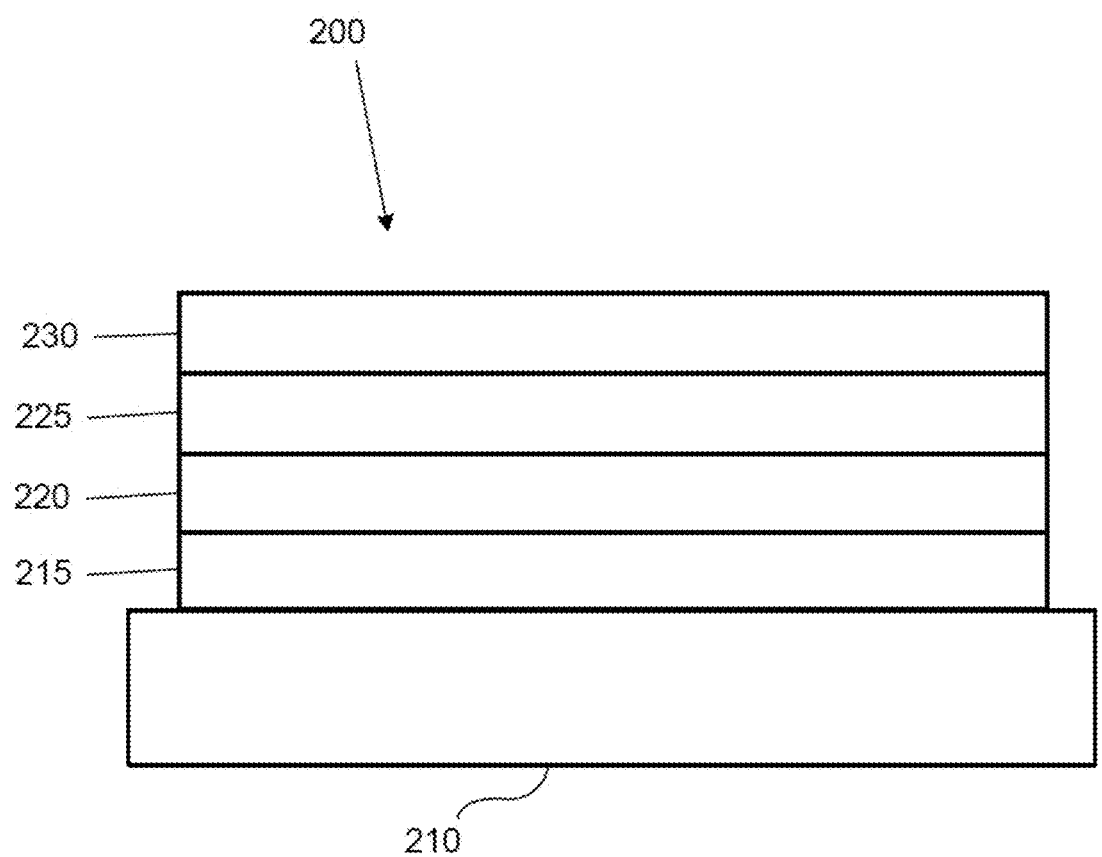
FIG. 2 shows an inverted organic light emitting device that does not have a separate electron transport layer.
Figure 3:
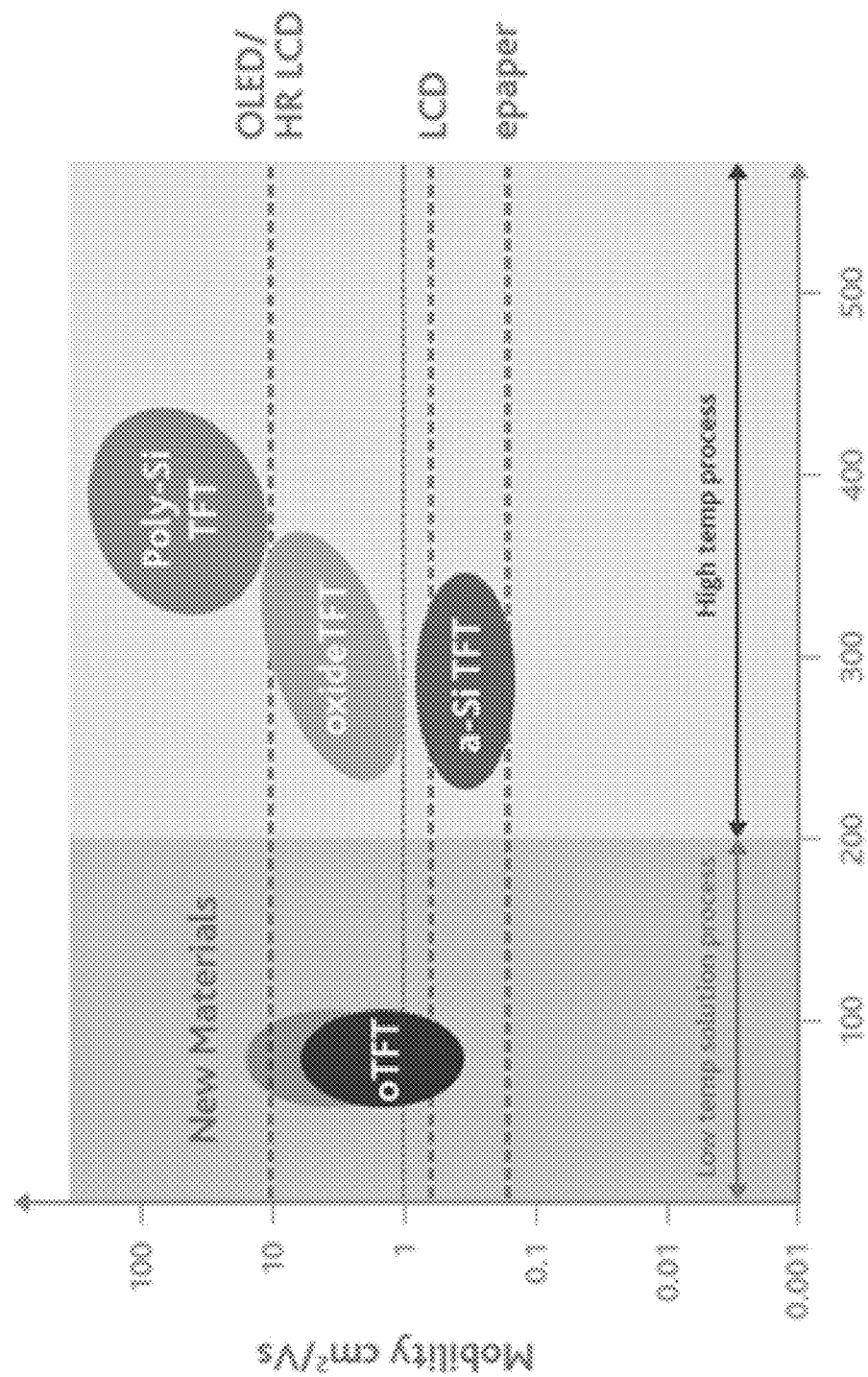
FIG. 3 shows processing temperatures for different materials used in construction of a backplane of a display.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 7.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et at, which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al, which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, wearable displays and wearable computing devices, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20°-25°

C.), but could be used outside this temperature range, for example, from −40° C. to 80° C.

Most current OLED displays are of the active matrix type, where a backplane having an array of thin film transistors controls the current flowing in each of the OLED elements. Such displays therefore have a TFT backplane, on top of which an OLED frontplane is deposited. Current OLED displays fabricated on plastic use low-temperature polycrystalline silicon (LTPS) backplanes on polyimide substrates, generally processed at greater than 300° C. To lower cost and enable flexibility, the embodiments of the disclosed subject matter tower the processing temperature so as to allow the use of lower cost substrate plastics, and to reduce stress-related issues due to mismatches in the thermal expansion of different layers in the device. In general, lower deposition temperatures reduce thin-film-transistor (TFT) performance, including mobility and stability. That is, there may be formation of the backplanes with TFTs at lower temperatures, where the TFTs of the backplane may be used to control the operation of display elements. However, in conventional devices, when TFT mobility is reduced, a higher source drain TFT Voltage is required to drive any given OLED current, on the TFT will consume more power.

OLED lifetime typically depends on operational temperature, so increased power consumed by the backplane will generally degrade display lifetime, due to this additional consumed power raising the overall display operating temperature. However, the embodiments of the disclosed subject matter provide devices having OLEDs that are operable at 500 cd/m$^2$ for more than 10,000 hours.

Current plastic-based OLED displays use low-temperature polycrystalline silicon (LTPS) as the backplane technology. While oxide, organic and amorphous silicon TFTs are being developed to be fabricated below 200° C., their performances to date are not as good as LTPS, and very little work has been reported on how the power consumption of backplanes based on these devices will impact OLED display operations from a power consumption and thermal viewpoint. To date, typical analysis relates backplane performance to OLED lifetime, and particularly discusses flexible displays with low processing temperatures having poorer TFT performances. However, embodiments of the disclosed subject matter provide flexible OLED backplanes for displays on low cost substrates.

With flexible displays, all the components included in the display must also be flexible. Typically, it is desirable to have a low processing temperature to form such displays, as high temperature plastics are very expensive. Mismatches in thermal expansions between different materials in different layers can cause high stresses to form, especially on flexing. Lower temperature TFTs typically have poorer performance, and thus will consume more power. Embodiments of the disclosure subject matter provide guidelines for TFT properties such that OLED lifetime will not be reduced more than a factor of two from room temperature operation, and OLED display devices having TFTs with such guidelines.

In typical active matrix OLED (AMOLED) displays, the OLED is driven by a TFT whose gate is controlled by a series of transistors, such that the current flowing through the transistor is controlled by external source drivers, depending on the video image to be rendered. As a result, the dominant power consumed in the backplane (i.e., that includes the TFTs) comes from the current flowing through the drive TFT and OLED device (in series) multiplied by the sum of the voltage drop across the two devices.

Using the results of simulated display power consumption versus display luminance shown in FIG. 4 and discussed below, embodiments of the disclosed subject matter may provide a device that includes an active-matrix driven flexible display including a plurality of OLEDs formed on a plastic substrate. Each OLED of the display may include a phosphorescent first emissive layer. The display may operate at a luminance value of at least 500 cd/m$^2$, with a luminance decay of not more than about 3% after 10,000 hours of operation. The OLEDs of the display may be formed on the plastic substrate having a glass transition temperature of the less than 200° C.

In embodiments of the disclosed subject matter, the plurality of OLEDs may be deposited by organic vapor jet printing (OVJP). The display of the device may be flexible so as to be conformable, and the plastic substrate of the device may be transparent. The device may include an organic TFT backplane to control the active-matrix driven flexible display including the plurality of OLEDs.

As discussed in detail below, backplane power consumption of a display depends on both the sub-pixel current, which is determined by the OLED efficiency and luminance, as well as the voltage across a TFT that supplies the sub-pixel current. The voltage across a TFT at any given drive current depends on both its mobility and threshold voltage. The increased power consumption in the backplane will increase the heat dissipation in the display. A high TFT threshold voltage results in a display power dissipation that is too high, and will generate too much heat. As discussed below in connection with FIG. 4, threshold voltages may be matched with TFT mobilities to achieve a display capable of 10,000 hours at 500 cd/m$^2$ display luminance. That is, threshold voltages and TFT mobilities may be selected so that the rise in output temperature of the display, as well as the power dissipation, may be controlled so as to achieve desirable display lifetimes.

A drive transistor of the active-matrix driven flexible display may have a voltage drop of less than 4V when the active matrix supplies current to the OLEDs producing an image at 500 cd/m$^2$. In another embodiment of the disclosed subject matter, a drive transistor of the active-matrix driven flexible display has a voltage drop of less than 6V when the active matrix supplies current to the OLEDs producing an image at 500 cd/m$^2$.

The mobility of a driver transistor of the active-matrix driven flexible display of the disclosed subject matter may be less than 25 cm$^2$/Vs. In another embodiment, the mobility of a driver transistor of the active-matrix driven flexible display may be less than 10 cm$^2$/Vs. The mobility of a driver transistor of the active-matrix driven flexible display may be greater than 1.5 cm$^2$/Vs in another embodiment of the disclosed subject matter.

A magnitude of the threshold voltage of a drive transistor of the active-matrix driven flexible display may be between 1.5V and 4V.

In embodiments of the disclosed subject matter, a temperature change of the active-matrix driven flexible display may be less than 14° C., where the display is operating at 500 cd/m$^2$. In another embodiment of the disclosed subject matter, the temperature change of the active-matrix driven flexible display may less than 20° C., where the display is operating at 500 cd/m$^2$.

A power dissipation of the active-matrix driven flexible display may be less than 35 mw/cm$^2$, where the display is operating at 500 cd/m$^2$.

The display may be a full-color display. The device including the display of the disclosed subject matter may be a wearable device, a watch, a computer, a flat panel display, a computer monitor, a medical monitor, a television, a billboard, a light for interior or exterior illumination, a signal, a color tunable or color temperature tunable lighting source, a heads-up display, a head mounted display, virtual reality glasses, smart glasses, a fully transparent display, a flexible display, wearable displays and wearable computing devices, a laser printer, a communication device, a telephone, a cell phone, a personal digital assistant (PDA), a laptop computer, a digital camera, a camcorder, a viewfinder, a micro-display, a vehicle, a large area wall, a theater or stadium screen, and a sign.

EXPERIMENTAL

Based on the known performance of the red, green, and blue OLED devices used to make high performance OLED displays, backplane and frontplane (display panel) power consumption can be simulated and/or determined as a function of display luminance. The OLED current for each sub-pixel may depend on many factors, including its color, fin-factor, the display white point, the luminance, polarizer efficiency, its current voltage characteristics, its luminous efficiency (cd/A), and the like. Transistor power consumption may depend on, for example, gate capacitance, TFT geometry (W/L), threshold voltage, mobility, and the like. As shown below, Table 1 provides assumed parameters for these variables.

TABLE 1

| | |
|---|---|
| Green OLED luminous efficiency | 100 cd/A |
| Red OLED luminous efficiency | 35 cd/A |
| Blue OLED luminous efficiency | 5.5 cd/A |
| OLED Voltage | 5 V |
| TFT Vth | Variable V |
| TFT Mobility | Variable cm$^2$/Vs |
| TFT W/L | 2.00 |
| TFT gate capacitance | 0.01 |
| Polarizer Efficiency | 44% |
| Green component (at white point) | 62% |
| Red component (at white point) | 27% |
| Blue component (at white point) | 11% |
| Percentage of pixels ON | 100% |

Figure 4:
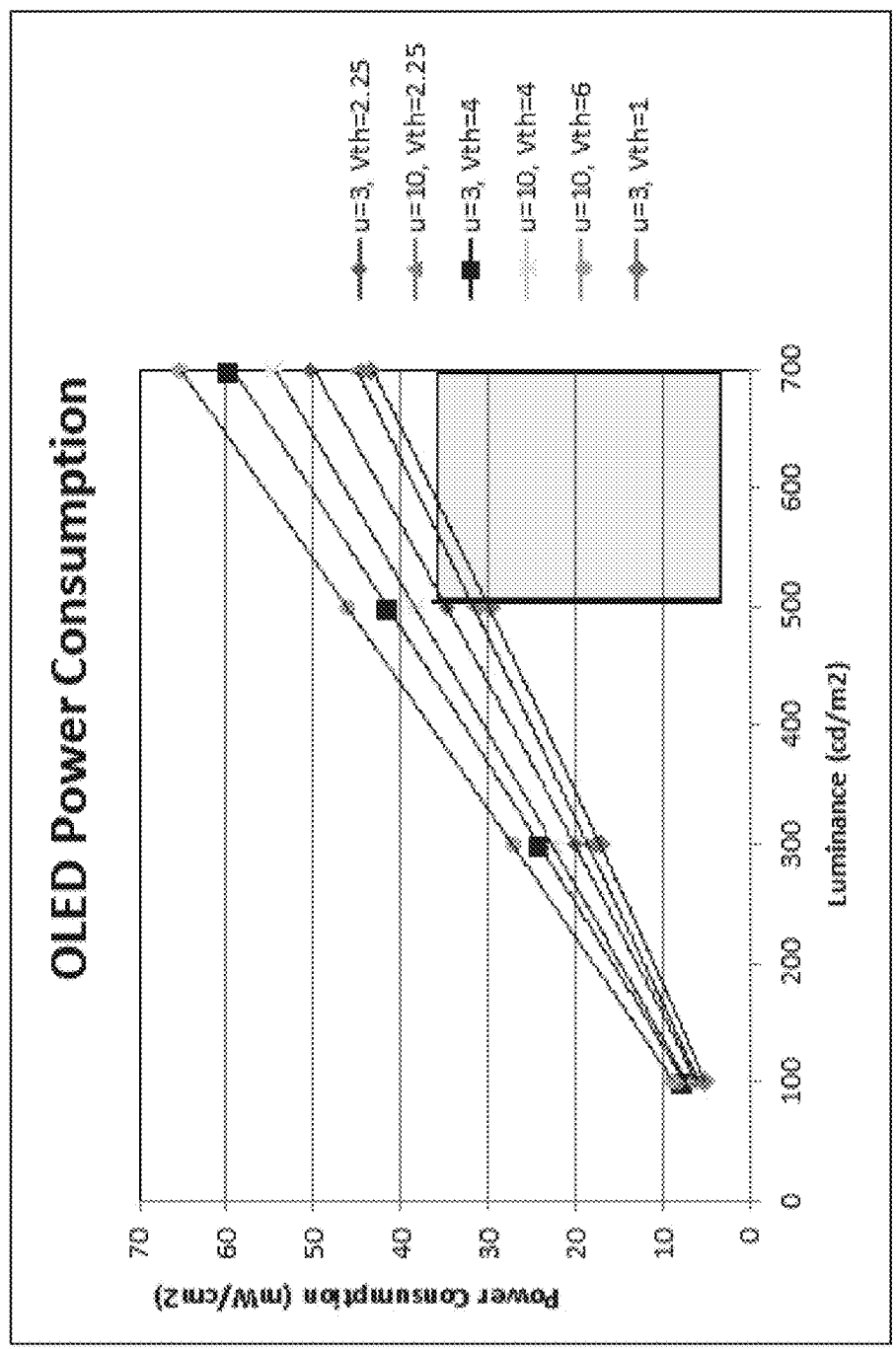
FIG. 4 shows a relationship between simulated display panel (e.g., that includes a backplane and an OLED frontplane) power consumption (mW/cm$^2$) and display luminance (nominal 400 dpi) for an OLED according to an embodiment of the disclosed subject matter.

FIG. 4 shows relationship between simulated display panel power consumption (mW/cm$^2$) and display luminance (nominal 400 dpi) for an OLED using the parameters disclosed in Table 1 above.

When analyzing the temperature rise of a display, in U.S. Pat. No. 8,766,531, it was determined that at a power density of 65 mW/cm$^2$, the temperature rise would be 26° C. Based on data showing that the lifetime of an OLED decreases by a factor of 1.6 for each 10° C. degree rise in temperature, it can be determined that the lifetime will halve for every 14° C. rise in operational temperature, corresponding to a power dissipation of 35 mW/cm$^2$.

Related U.S. Pat. No. 8,957,579, which is incorporated by reference, provides an AMOLED with a lifetime to 97% of initial luminance (LT97) of 20,000 hours at 500 cd/m$^2$ display luminance. The related patent and the AMOLED disclosed therein is without considering heat dissipation in the display, which is considered in the OLED display devices disclosed herein. The embodiments of the presently-disclosed subject matter provide a display with a LT97 of 10,000 hours at 500 cd/m$^2$. The disclosed subject matter herein is to ensure that the display temperature rise is less than 14° C., which is equivalent to less than 35 MW/cm$^2$ power dissipation in the display.

FIG. 4 shows results of simulated display power consumption versus display luminance for a nominal 400 dpi OLED (e.g., an AMOLED). Simulation parameters are provided in Table 1 above. Different plots show results for different combination of TFT mobilities, TFT mobility u cm$^2$/Vs and absolute threshold voltage (Vth). In the case of PMOS (P-type Metal Oxide Semiconductor) transistors, a positive value (i.e., a non-negative) for a threshold voltage is assumed.

Increased power consumption in the backplane will increase the heat dissipation in the display. The backplane power consumption depends on the sub-pixel current (determined by the OLED efficiency and luminance and the voltage across the TFT to supply the sub-pixel current.

From the highlighted rectangle area shown in FIG. 4, the criteria for obtaining LT97 greater than 10,000 hours at 500 cd/m$^2$ display luminance can be determined. As shown in FIG. 4, three sets of driver TFT performance allow for this criteria to be met (i.e., where u=3, Vth=2.25; u=10, Vth=2.25; and u=3, and Vth=1) and three do not (i.e., where u=3, Vth=4; u=10, Vth=4; and u=10, Vth=6). A high TFT threshold voltage (i.e., greater than 4V) results in a display power dissipation that is too high. For a threshold voltage of 1 V, the mobility needs to be greater than 1.0 cm$^2$/Vs to achieve the predetermined power level (e.g., a power requirement). For a threshold voltage of 1.5V, the mobility needs to be greater than 1.5 cm$^2$/Vs to achieve the predetermined power level (e.g., the power requirement). For a threshold voltage of 2 V, the mobility needs to be greater than 2.1 cm$^2$/Vs to achieve the predetermined power level (e.g., the power requirement). For a threshold voltage of 3 V, the mobility needs to be greater than 7.9 cm$^2$/Vs to achieve the power requirement.

There may be a predetermined value (e.g., a minimum requirement) for the magnitude of the TFT threshold voltage, as if it is too close to zero (0), then the TFT will have an unacceptable leakage current when the gate is at zero volts (0 V).

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art, it is understood that various theories as to why the invention works are not intended to be limiting.

I claim:

1. A device comprising:
    an active-matrix driven flexible display including a plurality of Organic Light Emitting Diodes (OLEDs) formed on a plastic substrate, wherein each OLED includes a phosphorescent first emissive layer,
    wherein the display operates at a luminance value of at least 500 cd/m$^2$ with a luminance decay of not more than about 3% after 10,000 hours of operation,
    wherein the display is formed on the plastic substrate having a glass transition temperature of the less than 200° C., and
    wherein a temperature change of an active display area operating temperature of the active-matrix driven flexible display is less than 20° C. when the display is operating at 500 cd/m$^2$.

2. The device of claim 1, wherein a drive transistor of the active-matrix driven flexible display has a voltage drop of less than 4V when the active matrix supplies current to the OLEDs producing an image at 500 cd/m$^2$.

3. The device of claim 1, wherein a drive transistor of the active-matrix driven flexible display has a voltage drop of less than 6V when the active matrix supplies current to the OLEDs producing an image at 500 cd/m$^2$.

4. The device of claim 1, wherein the mobility of a driver transistor of the active-matrix driven flexible display is less than 25 cm$^2$/Vs.

5. The device of claim 1, wherein the mobility of a driver transistor of the active-matrix driven flexible display is less than 10 cm$^2$/Vs.

6. The device of claim 1, wherein the mobility of a driver transistor of the active-matrix driven flexible display is greater than 1.5 cm$^2$/Vs.

7. The device of claim 1, wherein a magnitude of the threshold voltage of a drive transistor of the active-matrix driven flexible display is between 1.5V and 4V.

8. The device of claim 1, wherein the active-matrix driven flexible display is conformable.

9. The device of claim 1, further comprising an organic TFT backplane to control the active-matrix driven flexible display including the plurality of OLEDs.

10. The device of claim 1, wherein the plastic substrate is transparent.

11. The device of claim 1, wherein the plurality of OLEDs are deposited by organic vapor jet printing (OVJP).

12. The device of claim 1, wherein a temperature change of the active-matrix driven flexible display is less than 14° C., and wherein the display is operating at 500 cd/m$^2$.

13. A device of claim 1, wherein the device is a type selected from the group consisting of: a wearable device, a watch, a computer, a flat panel display, a computer monitor, a medical monitor, a television, a billboard, a light for interior or exterior illumination, a signal, a color tunable or color temperature tunable lighting source, a heads-up display, a head mounted display, virtual reality glasses, smart glasses, a fully transparent display, a flexible display, a laser printer, a communication device, a telephone, a cell phone, a personal digital assistant (PDA), a laptop computer, a digital camera, a camcorder, a viewfinder, a micro-display, a vehicle, a large area wall, a theater or stadium screen, and a sign.

14. The device of claim 1, wherein the display is a full-color display.

15. A device comprising:
   an active-matrix driven flexible display including a plurality of Organic Light Emitting Diodes (OLEDs) formed on a plastic substrate, wherein each OLED includes a phosphorescent first emissive layer,
   wherein the display operates at a luminance value of at least 500 cd/m$^2$ with a luminance decay of not more than about 3% after 10,000 hours of operation,
   wherein the display is formed on the plastic substrate having a glass transition temperature of the less than 200° C., and
   wherein a power dissipation of the active-matrix driven flexible display is less than 35 mW/cm$^2$ when the display is operating at 500 cd/m$^2$.

* * * * *